(12) United States Patent
Hurkx et al.

(10) Patent No.: US 6,597,052 B2
(45) Date of Patent: Jul. 22, 2003

(54) PUNCH-THROUGH DIODE HAVING AN INVERTED STRUCTURE

(75) Inventors: Godefridus Adrianus Maria Hurkx, Eindhoven (NL); Erwin Adolf Hijzen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 92 days.

(21) Appl. No.: 09/782,663

(22) Filed: Feb. 13, 2001

(65) Prior Publication Data

US 2001/0017389 A1 Aug. 30, 2001

(30) Foreign Application Priority Data

Feb. 15, 2000 (EP) .............................................. 00200510

(51) Int. Cl.[7] ............................................ H01L 29/861
(52) U.S. Cl. ........................ 257/497; 257/361; 257/362; 257/498
(58) Field of Search ................................. 257/280–282, 257/361–362, 497–498, 618

(56) References Cited

U.S. PATENT DOCUMENTS

| 5,880,511 A | 3/1999 | Yu et al. ..................... 257/497 |
| 6,459,133 B1 * | 10/2002 | Brown et al. ................ 257/497 |

OTHER PUBLICATIONS

Kamins et al., "Electrical and Structural Properties of Diodes Fabricated in Thick, Selectively Deposited Si/Si1–xGex Epitaxial Layers", 1992, IEEE, pp 177–179.*

* cited by examiner

*Primary Examiner*—George Fourson
*Assistant Examiner*—Thanh V Pham
(74) *Attorney, Agent, or Firm*—Steven R. Biren

(57) ABSTRACT

The invention relates to a so-called punch-through diode comprising a stack of, for example, an $n^{++}, p^-, p^+, n^{++}$ region (1, 2, 3, 4). In the known diode, these regions (1, 2, 3, 4) are arranged on a substrate (11) in said order. The diode is provided with connection conductors (5, 6). Such a diode does not have a steep I–V characteristic and hence is less suitable as a TVSD (=Transient Voltage Suppression Device). Particularly at voltages below 5 volts, a punch-through diode could form an attractive alternative for use as a TVSD.

A punch-through diode according to the invention has an inverted structure, which means that the regions (1, 2, 3, 4) are positioned in reverse order on the substrate (11) and thus, the first region (1) adjoins the surface, and the fourth region (4) adjoins the substrate (11). Such a diode has a very steep I–V characteristic, is very suitable as a TVSD and functions very well at an operating voltage below 5 volts. Preferably, the diode is provided with a field plate (6) and, also preferably, the first region (1) comprises a mixed crystal of silicon and germanium.

5 Claims, 1 Drawing Sheet

PUNCH-THROUGH DIODE HAVING AN INVERTED STRUCTURE

BACKGROUND OF THE INVENTION

The invention relates to a semiconductor device comprising a semiconductor body including a substrate and a stack of a first semiconductor region of a first conductivity type having a first doping concentration, a second semiconductor region having a second doping concentration, which is lower than the first doping concentration, a third semiconductor region of a second, opposite conductivity type having a third doping concentration ranging between the first and the second doping concentration, a fourth semiconductor region of the first conductivity type having a fourth doping concentration, which is higher than the third doping concentration, the first and the fourth semiconductor regions being provided with an electrical connection conductor, one of which is situated on the side of the substrate and the other is situated at the surface of the semiconductor body, an electric voltage being applied across said connection conductors during operation of the device, the thickness and the doping concentration of the second and the third semiconductor region being chosen to be such that they are completely depleted during operation. Such a device, which is also referred to as punch-through diode, is an attractive alternative to Zener diodes, particularly for operating voltages below approximately 5 volts, to suppress peak voltages, which can be attributed to the fact that such a device exhibits a steep punch-through characteristic and a low capacitance.

Such a device is disclosed in U.S. Pat. No. 5,880,511, published Mar. 9, 1999. In said document, a description is given of a diode with an $n^{++}$ substrate supporting a stack of regions, respectively a p–, a $p^+$ and an $n^{++}$ region. The substrate and the uppermost $n^+$ region are provided with connection conductors. The diode is mesa-shaped and the flanks are covered with an electrically insulating layer.

Experiments have shown that a drawback of the known device resides in that the I–V (=current-voltage) characteristic of the diode does not exhibit the desired trend, i.e. it does not exhibit a straight and steep transition, particularly when the known device is designed such that the so-called punch-through voltage is above 2 volts. In addition, the diode behavior is not stable.

SUMMARY OF THE INVENTION

Therefore, it is an object of the invention to provide a device of the type mentioned in the opening paragraph, wherein said drawback is overcome or at least substantially reduced, and which device exhibits a very straight and steep I–V, also if the punch-through voltage is above 2 volts, and which device is very stable.

To achieve this, a device of the type mentioned in the opening paragraph is characterized in accordance with the invention in that the first semiconductor region adjoins the surface of the semiconductor body, and the fourth semiconductor region is situated on the side of the substrate. It has been found that such a device exhibits a very steep I–V characteristic, also in the case of a design voltage (?) above 2 volts. The invention is based on the following recognition. A punch-through diode can be regarded as a bipolar transistor having an open base, i.e. without a base terminal. When the device is subjected to a forward voltage, the junction between the (lightly doped) $p^-$ region and the $n^{++}$ region, or if instead of a lightly doped $p^-$ region, a lightly doped $n^-$ region is present between the $p^+$ and the $n^-$ region, is slightly forward biased. This means that the $n^{++}$ region then serves as the emitter of the transistor, the $p^+$ region serves as the base and the $p^-$ region as a part of the base, and the $n^{++}$ substrate forms the collector. If the collector-emitter breakdown voltage of the transistor (=BVCEO) is lower than the punch-through voltage at any current intensity, the diode will exhibit a negative resistance behavior. This may cause instability, such as undesirable oscillation. A relation between the BVCEO and the junction breakdown voltage (=BVCBO) is: $BVCEO=BVCBO/\beta^{1/n}$, wherein $\beta$ is the current amplification, which is equal to the quotient of the base current (ib) and the collector current (ic), and n has a value between 3 and 4. The base current is determined by the recombination of holes and electrons in the lightly doped region, i.e. the $p^-$ or the $n^-$ region. In the known diode, the current amplification may be very high since the recombination in said regions is very low due to the long recombination lifetime of charge carriers in (bulk) silicon. This is the reason why BVCEO is low. If the first conductivity type is the $n^-$ conductivity type, then, in a structure inverted in accordance with the invention, the $n^{++}$ top region is required only to make satisfactory contact with the connection conductor. Said top region does serve as a barrier for holes but it can be embodied so as to be very thin. This means that many holes can recombine at the interface between the silicon and the connection conductor. Simulations have shown that, as a result thereof, the current amplification can be reduced by as much as a factor of 10. This serves as an explanation for the above-mentioned excellent results.

In an important embodiment, the first conductivity type is the n-conductivity type, and the second semiconductor region is of the second conductivity type, i.e. the p-conductivity type. Choosing the n-conductivity type has the advantage that the punch-through current is carried by electrons which, owing to their higher mobility, yield a lower series resistance, leading to limited power losses. Although the second semiconductor region may also be a lightly doped n-region, a second semiconductor region which is lightly p-doped results in a slightly higher base current and hence a slightly lower $\beta$, which, on account of the above, is favorable.

In a favorable modification, parts of at least the second and the third semiconductor region adjoin the surface of the semiconductor body, for example in that they form part of a mesa, and are covered with an electrically insulating layer over which one of the connection conductors extends. An important additional advantage of a device in accordance with the invention is that, in this modification, the uppermost connection conductor, provided it overlaps the $p^+$ region at the edges, can serve as a field plate. This implies that in the case of a positive voltage on the $n^{++}$ region adjoining the $p^+$ region, i.e. at a forward voltage, premature punch-through at the edge of the mesa is precluded. This too results in an increased steepness of the I–V characteristic, which is desirable. In the known device, on the contrary, such a field plate would lead to premature punch-through and hence enhance a non-steep I–V characteristic.

In a particularly favorable further modification, wherein the semiconductor body comprises silicon, the first semiconductor region comprises a mixed crystal of silicon and germanium.

By virtue of the presence of this mixed crystal, the above-mentioned barrier is further reduced. As a result, the current amplification can be further reduced, even a reduction by a factor of the order of one hundred being possible.

Also a small thickness of the first semiconductor region, for example in the range between 10 and 100 nm, contributes to a limited barrier-effect of this region. Such small thicknesses also enable the use of a silicon-germanium mixed crystal comprising a substantial germanium content, for example a content in the range from 20 to 30 atom %.

A method of manufacturing a semiconductor device, wherein a semiconductor body with a substrate is formed, which semiconductor body is provided with a stack of a first semiconductor region of a first conductivity type having a first doping concentration, a second semiconductor region having a second doping concentration, which is lower than the first doping concentration, a third semiconductor region of a second, opposite conductivity type having a third doping concentration ranging between the first and the second doping concentration, and a fourth semiconductor region of the first conductivity type having a fourth doping concentration, which is higher than the third doping concentration, the first and the fourth semiconductor region being provided with an electric connection conductor across which an electric voltage is applied during operation of the device, and the thickness and the doping concentration of the second semiconductor region being chosen to be such that, during operation, the second semiconductor region is completely depleted, is characterized in accordance with the invention in that the first semiconductor region is positioned at the surface of the semiconductor body, and the fourth semiconductor region is positioned on the side of the substrate. Such a method enables a device in accordance with the invention to be obtained in a simple manner.

Preferably, the n-type is chosen as the first conductivity type, and the second semiconductor region is provided with the p-conductivity type. In a favorable modification, parts of at least the second and the third semiconductor region adjoining the surface of the semiconductor body are provided with an electrically insulating layer, and one of the connection conductors is formed such that it extends over the insulating layer. In a favorable modification, the first semiconductor region is made of a mixed crystal of silicon and germanium. This region preferably has a thickness in the range between 10 and 100 nm.

These and other aspects of the invention will be apparent from and elucidated with reference to the embodiment(s) described hereinafter.

BRIEF DESCRIPTION OF THE DRAWING

In the drawings.

The Figures are not drawn to scale, particularly the dimensions in the thickness direction are exaggerated for clarity. Like reference numerals refer to like regions whenever possible, and regions of the same conductivity type are generally given the same hatching.

DESCRIPTION OF THE PREFERRED EMBODIMENTS

Figure 1:
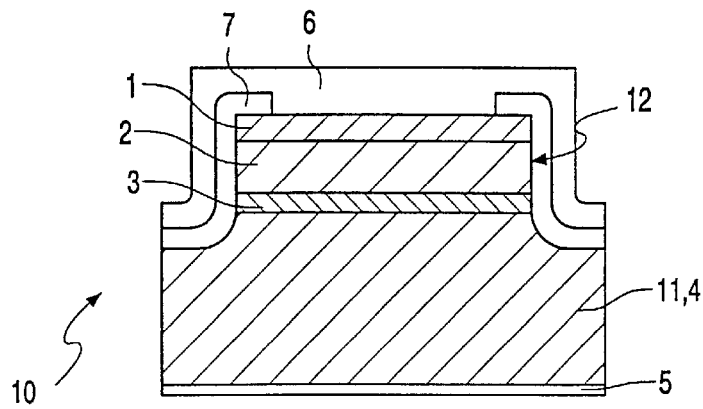
FIG. 1 is a diagrammatic, cross-sectional view, at right angles to the thickness direction, of a semiconductor device in accordance with the invention.

FIG. 1 is a diagrammatic, cross-sectional view, at right angles to the thickness direction, of a semiconductor device in accordance with the invention. The device, a so-called punch-through diode, comprises a semiconductor body 10 including an $n^{++}$ silicon semiconductor substrate 11 and a series of semiconductor regions 1, 2, 3, 4, which are, respectively, an $n^{++}$ region 1, a $p^-$ region 2, a $p^+$ region 3 and an $n^{++}$ region 4. The diode is provided with two connection conductors 5, 6. During operation of the diode, an electric voltage is applied across said connection conductors, and the thickness and doping concentration of the second and the third semiconductor region 2, 3 are chosen to be such that they are depleted during operation.

In accordance with the invention, the first semiconductor region 1 is situated at the surface of the semiconductor body 10, and the fourth semiconductor region 4 is situated on the side of the substrate 11. In this example, the fourth semiconductor region 4 coincides therewith. It has been found that such a device has a particularly steep I–V characteristic, also at a design voltage above 2 volts, which renders the device useful, even very attractive, as an alternative to Zener diodes to suppress voltage peaks. The invention is based on the following recognition. A punch-through diode can be regarded to be a bipolar transistor with an open base. In the case of a forward voltage and if the structure of the diode is reversed with respect to the structure shown in FIG. 1, as is the case in the known device, which implies that the fourth region 4 adjoins the surface and the first region 1 adjoins the substrate 11, then the junction between the $p^-$ region 2 and the $n^{++}$ region 1 in said open-base bipolar transistor is slightly forward biased. The $n^{++}$ region 4 then serves as the collector of the transistor. The $p^+$ region 3 serves as the base and the $p^-$ region 2 serves as a part of the base, and the $n^{++}$ top region 1 forms the emitter. If the breakdown voltage between the collector and the emitter of the transistor (=BVCEO) is lower than the punch-through voltage at any current intensity, the diode will exhibit a so-called negative resistance behavior. A relation between the BVCEO and the junction breakdown voltage (=BVCBO) is: BVCEO= BVCBO/$\beta^{1/n}$, wherein $\beta$ is the current amplification, which is equal to the quotient of the base current (ib) and the collector current (ic), and n has a value in the range between 3 and 4. The base current is determined by the recombination of holes and electrons in the slightly doped p-region 2. In the known diode, the current amplification may be very high because the recombination in said region is very low due to the long recombination lifetime of charge carriers in (bulk) silicon. As a result, BVCEO is low. In a structure which is inverted in accordance with the invention, (see FIG. 1), the $n^{++}$ top region 1 is necessary only to make contact with the connection conductor 6 in a satisfactory manner. Said $n^{++}$ top region does act as a barrier for holes, but it can be embodied so as to be very thin. This means that many holes can recombine at the interface between the silicon and the connection conductor 6. Simulations have shown that, as a result thereof, the current amplification can be reduced by as much as a factor of 10. This explains the extremely steep I–V characteristic of a device in accordance with the invention, which is not, or much less, affected by negative resistance behavior. In addition, the diode is very stable.

Doping concentrations that prove to be suitable for the first, the second, the third and the fourth semiconductor region 1, 2, 3, 4 are, respectively, at least $10^{17}$ to $10^{20}$ at/cm$^3$, $10^{14}$ to $10^{17}$ at/cm$^3$, $10^{16}$ to $10^{18}$ at/cm$^3$ and $10^{17}$ to $10^{20}$ at cm$^3$. In this example, said doping concentrations are, respectively, $5\times10^{18}$, $10^{15}$, $10^{17}$ and $10^{18}$ at/cm$^3$. The thicknesses of said regions 1, 2, 3, 4 are, respectively, 10 nm, 1 μm, 200 nm and 300 μm. In more general terms, it can be said that the doping of the fourth region 4 is at least ten times that of the third region 3, and the doping of the second region 2 is less than one tenth of the doping of the third region 3. If, like in this example, the second region 2 is a $p^-$ region, then it applies to the second and the third region 2, 3, that the sum of the products of thickness and doping concentration is approximately $2*10^{12}$ at/cm$^3$.

In this example, the semiconductor body 10 comprises an approximately square mesa 12 with rounded corners and having a surface area of 200×200 μm² and a height of 2 μm, which mesa comprises at least the first, the second and the third semiconductor regions 1, 2, 3 and, in this case, also a part of the fourth region 4, and the walls of which are covered with an insulating layer 7, in this case a 300 nm thick layer of silicon dioxide, over which the connection conductor 6 extends to at least beyond the third semiconductor region 3. As a result, the connection conductor 6 also serves as a so-called field plate 6, which precludes, notably in a device in accordance with the invention, that premature punch-through occurs near the edge of the mesa 12.

A comparatively small thickness between 10 and 100 nm of the first semiconductor region 1, which only serves as a low-impedance contact between the connection conductor 6 and the second semiconductor region 2, also contributes to the effect of the invention. The same applies to the fact that the first region 1 comprises, in this example, a mixed crystal of germanium and silicon. The comparatively high germanium content, in this example 25 at. %, can be attributed in particular to the above-mentioned small thickness of the first region 1.

The two connection conductors 5, 6 comprise 10 nm AlSi, 100 nm TiW(N) and 0.5 μm Al. The lateral dimensions of the semiconductor body 10 are approximately 10 μm larger than the mesa 12.

Figure 2:
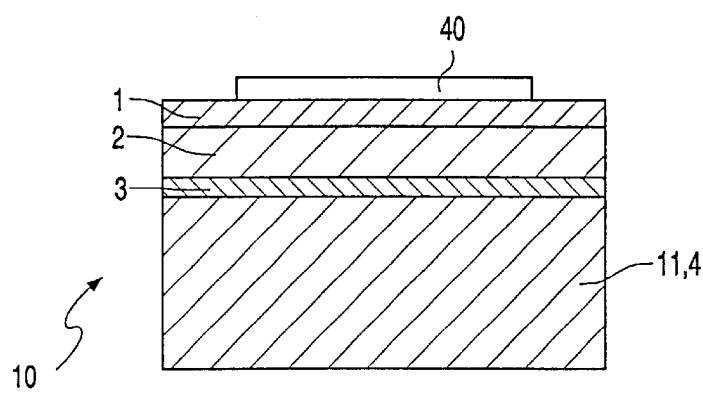
FIGS. 2 through 4 are diagrammatic, cross-sectional views, at right angles to the thickness direction, of the device shown in FIG. 1 in successive stages of the manufacture, using a method in accordance with the invention.
Figure 3:
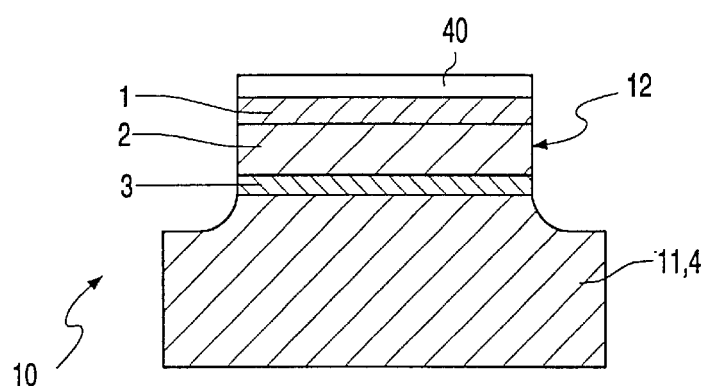
Figure 4:
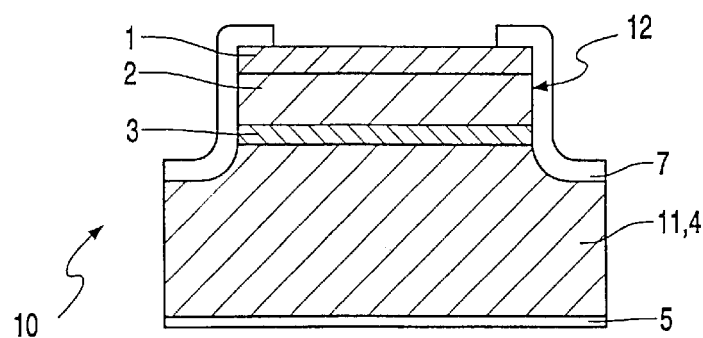

FIGS. 2 through 4 are diagrammatic, cross-sectional views, at right angles to the thickness direction, of the device shown in FIG. 1 in successive stages in the manufacturing process using a method in accordance with the invention. There is started from (see FIG. 2), an n-type Si substrate 11 which, in this case, forms a fourth semiconductor region 4. A third semiconductor region 3 is formed on the substrate 11, 4 by applying an epitaxial layer 3 of p-type silicon, in this case by means of non-selective gas phase epitaxy at a temperature of 700° C. Subsequently, a second semiconductor region 2 is formed in a similar manner by applying a p-type epitaxial layer 2 of Si. Next, a first semiconductor region 1 is formed in the same manner by providing an n-type epitaxial layer 1 of Si. During the deposition of the epitaxial layer 1, a germanium-containing gaseous compound, for example germanium hydride (GeH$_4$), is added to the gas used for this purpose in a concentration such that the resulting epitaxial layer 1 has a germanium content of 25 at. %. Subsequently, a masking layer 40 is provided by means of CVD (=Chemical Vapor Deposition), whereafter the masking layer is patterned by means of photolithography.

Next, (see FIG. 3), a mesa 12 is formed by means of etching, in this case by means of a plasma-etch technique. Subsequently, after the removal of the masking layer 40, the mesa 12 (see FIG. 4) is covered with a passivating layer 7, in this case of silicon dioxide, which is applied by means of PECVD (=Plasma Enhanced Chemical Vapor Deposition). A contact opening is formed in the passivating layer 7 on top of the mesa 12 by means of photolithography and etching, and after two-sided metallization 5, 6, as described hereinabove, the invention in accordance with the invention is ready for final assembly.

The invention is not limited to the example described herein and, within the scope of the invention, many modifications and variations are possible to those skilled in the art. For example, different thicknesses, different (semiconductor) materials or different compositions can be used. It is also possible to replace all conductivity types by the opposite conductivity type.

Various process steps, which are not relevant to the invention, can be carried out in a different way, for example, an oxide layer obtained by plasma deposition can also be obtained by deposition from the gas phase.

Finally, it is noted that the application of the device and the method in accordance with the invention is not limited to discrete devices. Other (semiconductor) components can be integrated in the semiconductor body.

What is claimed is:

1. A semiconductor device comprising a semiconductor body (10) including a substrate (11) and a stack of a first semiconductor region (1) of a first conductivity type having a first doping concentration, a second semiconductor region (2) having a second doping concentration, which is lower than the first doping concentration, a third semiconductor region (3) of a second, opposite conductivity type having a third doping concentration ranging between the first and the second doping concentration, a fourth semiconductor region (4) of the first conductivity type having a fourth doping concentration, which is higher than the third doping concentration, the first and the fourth semiconductor regions (1, 4) being provided with an electrical connection conductor (5, 6), one (5) of which is situated on the side of the substrate (11) and the other (6) is situated at the surface of the semiconductor body (11), an electric voltage being applied across said connection conductors during operation of the device, the thickness and the doping concentration of the second and the third semiconductor region (2, 3) being chosen to be such that they are completely depleted during operation, characterized in that the first semiconductor region (1) adjoins the surface of the semiconductor body (10), and the fourth semiconductor region (4) is situated on the side of the substrate (11).

2. A semiconductor device as claimed in claim 1, characterized in that the first conductivity type is the n-conductivity type, and the second semiconductor region is of the second conductivity type.

3. A semiconductor device as claimed in claim 1, characterized in that parts of at least the second and the third semiconductor region (2, 3) that are situated at the surface of the semiconductor body (10) are covered with an electrically insulating layer (7) over which one (6) of the connection conductors (5, 6) extends.

4. A semiconductor device as claimed in claim 1, wherein the semiconductor body (10) comprises silicon, characterized in that the first semiconductor region (1) comprises a mixed crystal of silicon and germanium.

5. A semiconductor device as claimed in claim 1, characterized in that the thickness of the first semiconductor region (1) ranges between 10 and 100 nm.

* * * * *